(12) United States Patent
Nakai et al.

(10) Patent No.: US 8,867,123 B2
(45) Date of Patent: Oct. 21, 2014

(54) HIGH-POWER PULSED LIGHT GENERATOR

(75) Inventors: Michihiro Nakai, Sakura (JP); Yasuhiro Oba, Sakura (JP)

(73) Assignee: Fujikura Ltd., Tokyo (JP)

( * ) Notice: Subject to any disclaimer, the term of this patent is extended or adjusted under 35 U.S.C. 154(b) by 211 days.

(21) Appl. No.: 13/605,535

(22) Filed: Sep. 6, 2012

(65) Prior Publication Data

US 2013/0057949 A1 Mar. 7, 2013

(30) Foreign Application Priority Data

Sep. 6, 2011 (JP) ................................. 2011-193777

(51) Int. Cl.
- H04B 10/17 (2006.01)
- H01S 5/00 (2006.01)
- H01S 3/067 (2006.01)
- H01S 3/0941 (2006.01)
- H01S 3/102 (2006.01)
- H01S 3/094 (2006.01)
- H01S 5/068 (2006.01)

(52) U.S. Cl.
CPC ......... H01S 3/06754 (2013.01); H01S 3/09415 (2013.01); H01S 3/094011 (2013.01); H01S 5/06825 (2013.01); H01S 3/1024 (2013.01)
USPC ...................... 359/337; 359/341.31

(58) Field of Classification Search
USPC .................. 359/337, 341.3, 341.31
See application file for complete search history.

(56) References Cited

U.S. PATENT DOCUMENTS

| 5,283,794 A | 2/1994 | Gibbs et al. |
| 5,325,383 A | 6/1994 | Davis et al. |
| 5,343,286 A * | 8/1994 | Keeble et al. ................. 356/73.1 |
| 5,867,305 A | 2/1999 | Waarts et al. |
| 5,933,271 A | 8/1999 | Waarts et al. |
| 6,081,369 A | 6/2000 | Waarts et al. |
| 6,917,415 B2 * | 7/2005 | Gogolla et al. ............... 356/5.06 |
| 2004/0085526 A1 * | 5/2004 | Gogolla et al. ............... 356/4.01 |
| 2005/0092722 A1 * | 5/2005 | Dane et al. ................ 219/121.73 |
| 2010/0135340 A1 * | 6/2010 | Kitabayashi ....................... 372/6 |

FOREIGN PATENT DOCUMENTS

| CN | 101682163 A | 3/2010 |
| CN | 101842946 A | 9/2010 |
| JP | 2011-100954 A | 5/2011 |
| JP | 2011-134735 A | 7/2011 |

OTHER PUBLICATIONS

Office Action issued by Chinese Patent Office in Chinese Application No. 201210326115.0 mailed Jul. 3, 2014.

* cited by examiner

Primary Examiner — Eric Bolda
(74) Attorney, Agent, or Firm — Sughrue Mion, PLLC

(57) ABSTRACT

A high-power pulse light generator includes: a master oscillator generating oscillated pulse light in synchronization with a master clock signal; an optical amplifier amplifying the oscillated pulse light output from the master oscillator and outputting high-power pulsed light; a driving unit driving a pumping semiconductor laser in synchronization with the master clock signal; and a control unit controlling the driving unit so that the driving current to be supplied to the pumping semiconductor laser becomes lower than or equal to a set value at which the pumping semiconductor laser is not in a laser oscillation state when returning light from an irradiated body with the high-power pulsed light reaches the pumping semiconductor laser connected to the optical amplifier, the control unit determining a timing of the control in accordance with an optical path length between the irradiated body and the pumping semiconductor laser.

6 Claims, 6 Drawing Sheets

PRIOR ART

PRIOR ART

HIGH-POWER PULSED LIGHT GENERATOR

CROSS-REFERENCE TO RELATED APPLICATION

This application is based on and claims priority from Japanese Patent Application No. 2011-193777, filed on Sep. 6, 2011, the content of which is incorporated herein by reference.

BACKGROUND OF THE INVENTION

1. Field of the Invention

The present invention relates to a pulsed light generator which is referred to a solid-state laser, a fiber laser, a fiber amplifier, or the like and has a function of amplifying a pulsed light using a semiconductor laser as a pumping light source.

2. Background Art

Conventionally, as a pumping light source for an amplification medium in some pulsed light generators such as solid-state lasers, fiber lasers, or fiber amplifiers, a semiconductor laser (laser diode: LD) that outputs light from a fiber has been used.

For an LD as a pumping light source (hereinafter referred to as a pumping LD), for example, a shunt type constant current driving circuit as shown in FIG. 6 is often used, and in that case, a constant output power is maintained continually with the pumping LD.

A basic shunt type driving circuit shown in FIG. 6 is composed of a shunt resistor 52, a comparator 53 such as an OP amplifier, and a transistor 54.

In this shunt type driving circuit, a voltage signal is input to the comparator 53, and an output of the comparator 53 is input to the transistor 54 (a base side).

An output on a collector side of the transistor 54 returns to the comparator 53 with a potential pattern made by the shunt resistor.

If an output on an emitter side of the transistor 54 is applied to the pumping LD 3 as a driving current, an optical output corresponding to the driving current is obtained from the pumping LD 3.

The shunt type driving circuit described above is advantageous to keep the current at a constant value, but is unable to change at high speed between a state where the pumping LD 3 is laser-oscillated (hereinafter, ON state) and a state where the pumping LD 3 is not laser-oscillated (OFF state).

On the other hand, as represented by a switching power supply, a constant voltage circuit adopting a switching element has generally been used.

The reason is that it is easy to minimize losses in a device in which a power circuit or a power supply circuit uses the constant voltage circuit adopting the switching element.

A technology to adopt the power circuit or the power supply circuit in a pumping LD of an optical amplifier is also known.

In the specification of U.S. Pat. No. 5,325,383 and the specification of U.S. Pat. No. 5,283,794, a technology to perform pulse driving of a pumping LD using pulse width modulation (PWM) is disclosed.

An LD driving method that makes the start of an output pulse fast by driving an LD through correlation between a phase of a switching frequency and a phase of a pulse frequency is disclosed in some technical literatures (for example, see specifications of U.S. Pat. No. 5,867,305, U.S. Pat. No. 5,933,271, and U.S. Pat. No. 6,081,369).

Theses literatures disclose a technology to intermittently drive the pumping LD at a time that is shorter than the excitation life of the amplification medium in order to remove noise (for example, amplified spontaneous emission (ASE) light or light of Rayleigh scattering) that limits a gain or peak power in the pulse amplification.

Furthermore, a technology to improve a gain through synchronizing the frequency of the pumping pulse light in the pumping light source that outputs a pulse laser (amplifier of the pulsed light) with the signal frequency is already known.

Since the pulsed light generator using the above-described LD as the pumping light source can obtain an output light that has high peak power, it is frequently used for laser processing or laser measurement.

In a laser processing device or a laser measurement device, however, if the pulsed light that is emitted from the high power pulsed light generator is reflected from the surface of an irradiated body or from a position that is near the surface of the irradiated body, the situation frequently occurs in which the pulsed light emitted from an output port of the pulsed light generator becomes incident light to the device in the direction opposite to the emission direction of the output pulsed light and returns to the device and is propagated to the optical amplifier.

Moreover, part of the reflected light that is reflected from the irradiated body reaches the pumping LD of the optical amplifier, and corresponding to the driving state of the pumping LD, may damage the pumping LD.

In the conventional technique that appears in the above-described literature, the problem that the pumping LD is damaged by the reflected light is not particularly considered, and thus, conventionally, damage to the pumping LD due to the reflected light, which is reflected from the irradiated body and is incident into the high power pulsed light generator, cannot be avoided.

As described above, the conventional high power pulsed light generator using the LD as the pumping light source has the problem that the light which is reflected by the irradiated body and is transferred into the device to be incident to the optical amplifier (hereinafter called a "returning light from the irradiated body") reaches the pumping LD that is in a laser oscillation state to damage the pumping LD.

SUMMARY OF THE INVENTION

One aspect of the present invention has been made to solve the above-mentioned problems occurring in view of the above-described situation, and one aspect of the present invention is to provide a high power pulsed light generator which can solve the problem that a pumping LD of an optical amplifier is damaged by a returning light from an irradiated body and thus prevent the damage of the pumping LD.

The inventors have investigated the above-described problem that the pumping LD is damaged by the returning light, and have found that the outbreak probability of the damage of the pumping LD is remarkably decreased in the case where the pumping LD is not in the laser oscillation state, that is, the pumping LD is in an OFF state, when the returning light is incident to the pumping LD.

Based on such knowledge, the inventors have solved the above-described problem in a manner in which damage to the pumping LD by the returning light from the irradiated body is avoided through suitably setting a timing at which the pumping light is injected into the optical amplifier having the amplification medium and a timing at which the returning light from the irradiation medium reaches the pumping LD to a suitable condition.

Accordingly, a high-power pulse light generator of a first aspect of the invention includes: a master clock generator generating a master clock signal; a master oscillator generating oscillated pulse light in synchronization with the master clock signal; an optical amplifier amplifying the oscillated pulse light output from the master oscillator and outputting high-power pulsed light; a pumping semiconductor laser (pumping LD) generating pumping pulse light used for exciting the optical amplifier; a driving unit driving the pumping semiconductor laser by use of a pulsed driving current in synchronization with the master clock signal; and a control unit controlling the driving unit.

The control unit controls the driving unit so that the driving current to be supplied to the pumping semiconductor laser becomes lower than or equal to a set value at which the pumping semiconductor laser is not in a laser oscillation state when returning light from an irradiated body with the high-power pulsed light reaches the pumping semiconductor laser connected to the optical amplifier. Additionally, the control unit determines a timing of the control in accordance with an optical path length between the irradiated body and the pumping semiconductor laser.

In other words, the timing, at which the returning light (pulsed light) from the irradiated body with the high-power pulsed light reaches the pumping LD through the optical amplifier, is determined in accordance with the optical path length between the irradiated body and the pumping LD. At this timing, the driving current of the pumping LD is controlled to be lower than or equal to the set value such that the pumping LD is not in a laser oscillation state.

According to the high-power pulse light generator of the above-described first aspect, the driving current of the pumping LD can be controlled at the timing in synchronization with the master clock signal. Based on the distance between the pumping LD and the irradiated body, it is possible to calculate the length of time in which the high-power pulsed light is emitted and the returning light from the irradiated body reaches the pumping LD. Consequently, at the time when the returning light reaches the pumping LD, due to the control unit controlling the driving current of the pumping LD to be lower than or equal to the set value at which the pumping LD is not in a laser oscillation state, it is possible to avoid the pumping LD from being optically damaged.

Particularly, the set value has only to be the value at which the pumping LD is not in a laser oscillation state (lower than or equal to near oscillation threshold value), actually, the value is determined according to an LD element to be used.

In the high-power pulse light generator of the first aspect, it is preferable that the high-power pulse light generator according to a second aspect of the invention include a monitoring unit provided between the master oscillator and the optical amplifier, the monitoring unit detecting the oscillated pulse light and the returning light, the monitoring unit generating an oscillated pulse detection signal based on a temporal analysis of the oscillated pulse light and a returning pulse detection signal based on a temporal analysis of the returning light. It is preferable that the oscillated pulse detection signal and the returning pulse detection signal be electrically led to the control unit; and the control unit controls, based on the oscillated pulse detection signal and the returning pulse detection signal, a period in which the driving current supplied to the pumping semiconductor laser become lower than or equal to the set value.

According to the high-power pulse light generator of the second aspect, it is possible to preliminarily examine a time difference from when the monitoring unit receives the oscillated pulse light output from the master oscillator till when the returning light is received by the monitoring unit. Because of this, until the time difference elapses after the monitoring unit receives the light at the first light receiving timing, due to the control unit controlling the driving current of the pumping LD to be lower than or equal to the set value at which the pumping LD is not in a laser oscillation state, it is possible to avoid the pumping LD from being optically damaged.

However, in the high-power pulse light generator, since the oscillated pulse light and the returning light from the irradiated body are received by the monitoring unit, it is not possible to immediately distinguish whether the received light is oscillated pulse light or the received light is returning light. Therefore, in this case, the high-power pulse light generator trial-emits the output-pulsed light before emitting the output-pulsed light as a practical matter, it is desirable that the period is adequately determined by checking the time difference between the first feedback timing of the light receiving and the second feedback timing of the light receiving.

In the high-power pulse light generator of the first aspect, it is preferable that the high-power pulse light generator according to a third aspect of the invention include: a first monitoring unit provided between the master oscillator and the optical amplifier, the first monitoring unit detecting the oscillated pulse light and generating an oscillated pulse detection signal based on a temporal analysis of the oscillated pulse light; and a second monitoring unit provided between the master oscillator and the optical amplifier, the second monitoring unit detecting the returning light and generating a returning pulse detection signal based on a temporal analysis of the returning light. It is preferable that the oscillated pulse detection signal and the returning pulse detection signal be electrically led to the control unit; and the control unit controls, based on the oscillated pulse detection signal and the returning pulse detection signal, a period in which the driving current supplied to the pumping semiconductor laser become lower than or equal to the set value.

According to the high-power pulse light generator of the third aspect, it is possible to appropriately and accurately examine the time difference between the timing, at which the oscillated pulse light output from the master oscillator is received by the first monitoring unit, and the timing, at which the returning light from the irradiated body is received by the second monitoring unit. Thus, even where there is change in the distance between the high-power pulse light generator and the irradiated body in a state where the output-pulsed light is emitted, until the time difference elapses after the light receiving timing in the first monitoring unit, due to the control unit controlling the driving current of the pumping LD to be lower than or equal to the set value at which the pumping LD is not in a laser oscillation state, it is possible to avoid the pumping LD from being optically damaged.

In any of the high-power pulse light generators of the first aspect to the third aspect, in the high-power pulse light generator of the fourth aspect of the invention, it is preferable that, in synchronization with the master clock signal, the driving current of the pumping LD be controlled so as to exceed the set value and to be the value at which the pumping LD is in a laser oscillation state at the timing, after the returning light reaches the pumping LD.

According to the high-power pulse light generator of the fourth aspect, in a state where the pumping LD is not laser-oscillated, the pumping LD immediately becomes a laser oscillation state at the timing in synchronization with the subsequent master clock signal after the returning light from the energized irradiated body reaches the pumping LD, it is possible to inject pumping light into the optical amplifier. Consequently, in a state where the pumping LD is avoided from being optically damaged which is caused by the returning light, effective laser beam machining or laser measurement by use of the high-power pulse light generator can be carried out.

According to the high power pulsed light generator of the invention, since the pumping LD is not in the laser oscillation state when the returning light from the irradiated body reaches the pumping LD, the damage of the pumping LD due to the returning light can be prevented.

DESCRIPTION OF THE PREFERRED EMBODIMENTS

Hereinafter, an embodiment of the invention will be described with reference to the drawings.

In a high power pulsed light generator, regarding a timing to amplify a pulsed light (oscillation pulsed light) emitted from a master oscillator and a timing to inject pumping light (pumping pulse light) into an amplification medium in an optical amplifier, there is a desired timing to prevent the damage of a pumping LD due to a returning light from a body to be irradiated.

Hereinafter, a desired timing to prevent the damage of the pumping LD will be described with reference to FIGS. 1 and 2.

Figure 1:
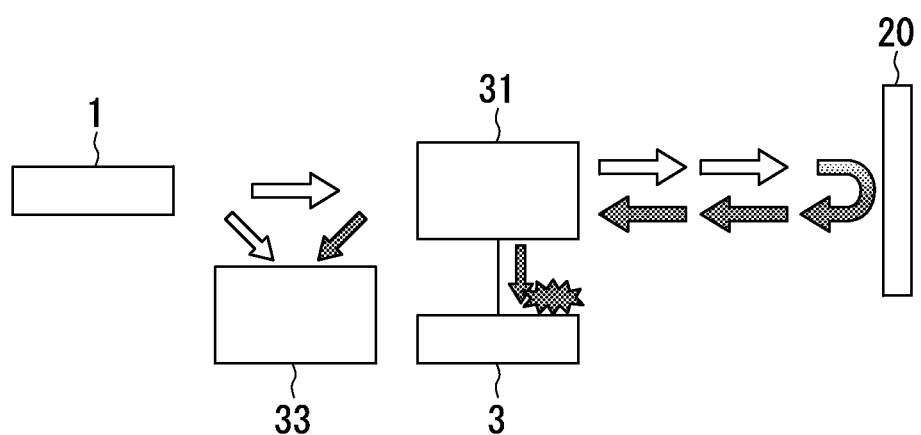
FIG. 1 is a diagram illustrating the basic configuration of a conventionally-used general high power pulsed light generator.

FIG. 1 is a diagram illustrating the basic configuration of a conventionally-used general high power pulsed light generator.

The oscillation pulsed light emitted from the master oscillator 1 is branched into two systems. One oscillation pulsed light (first oscillation pulsed light) is incident to the optical amplifier 31, and the remaining oscillation pulsed light (second oscillation pulsed light) is led to and detected by a signal light and reflected light monitor unit 33.

The branching ratio of the pulsed lights (first oscillation pulsed light and second oscillation pulsed light) is set so that an amount of light power that is incident to the optical amplifier 31 becomes larger than an amount of light power that is led to the signal light and reflected light monitor unit 33.

The light branched as described above enters the optical amplifier 31, and is incident to an amplification medium (not illustrated) provided inside the optical amplifier 31. The incident light is amplified by the amplification medium, and is output from the amplification medium as an output pulsed light.

The amplification medium in the optical amplifier 31 is optically connected to a pumping LD 3.

The irradiated body 20 is irradiated with the output pulsed light that is emitted from the optical amplifier 31, and part of the output pulsed light is reflected by the irradiated body 20.

The reflected light becomes a returning light as indicated by a black thick arrow (left side) in FIG. 1 to be incident to the high power pulsed light generator, and part of the returning light reaches the pumping LD 3 through the optical amplifier 31.

At this time, if the pumping LD 3 is in an ON state as described above, the pumping LD 3 may be damaged.

Furthermore, part of the returning light incident to the optical amplifier 31 except for the light incident to the pumping LD 3 is incident to the signal light and reflected light monitor unit 33.

Part of the returning light that is incident to the signal light and reflected light monitor unit 33 becomes an index to determine existence/nonexistence of the returning light incident to the pumping LD 3.

Figure 2:
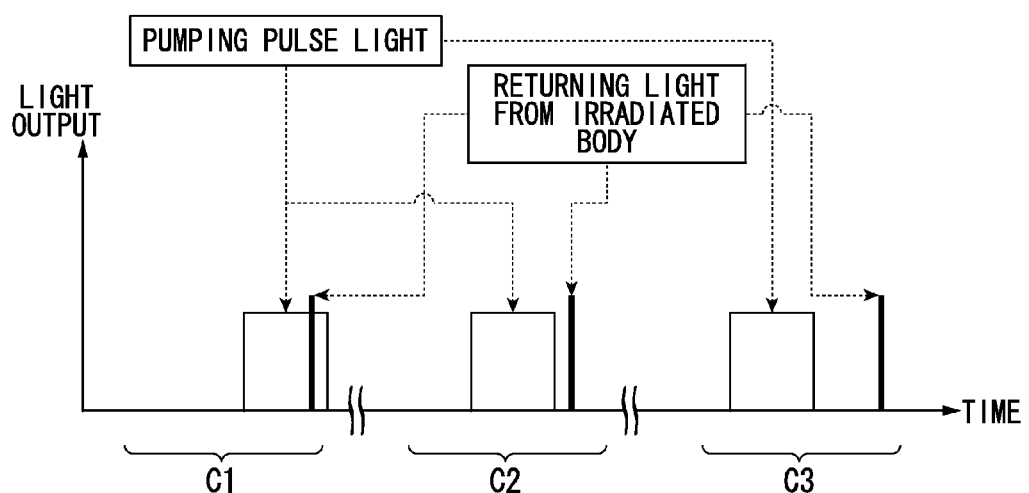
FIG. 2 is a diagram schematically illustrating a timing of a returning light of an irradiated body of an output pulsed light and a timing of a pulsed output of a pumping LD (pumping pulse light)

In the high power pulsed light generator having the above-described configuration, the relationship between the timing to inject the pumping light into the amplification medium of the optical amplifier and the timing at which the returning light from the irradiated body reaches the pumping LD is shown in FIG. 2.

In FIG. 2, the horizontal axis represents elapsed time including time domains C1, C2, and C3, and the vertical axis represents an optical fiber output.

In the case of the domain C1 of FIG. 2, a high-level driving current pulse that makes the pumping LD in an ON state (that is, a driving current pulse of a high level that exceeds the predetermined value) is applied to the pumping LD 3, and in a period in which the power of the pulse output (pumping pulse light) of the pumping LD 3 is high, the returning light from the irradiated body is incident to the pumping LD 3.

In this state, if the returning light from the irradiated body is incident to the pumping LD 3, the pumping LD 3 may be damaged due to an optical damage or the like.

In the case of the domain C2 of FIG. 2, at the timing when the returning light from the irradiated body reaches the pumping LD 3, the driving current of the pumping LD 3 is decreased to a low value (a low level that is equal to or lower than the predetermined value) that makes the pumping LD 3 in an OFF state, and thus the pumping LD is not in a laser oscillation state, that is, the light output of the pumping LD 3 is in a low state.

In this state, if the returning light from the irradiated body is incident to the pumping LD 3, the pumping LD 3 is not damaged without optical damage.

Even in the case of the domain C3 of FIG. 2, in the same manner as the case of the domain C2, when the returning light from the irradiated body reaches the pumping LD 3, the driving current of the pumping LD 3 decreases so as to be a low value (a low level that is equal to or lower than the predetermined value) at which the pumping LD 3 is in an OFF state (light emission that is not by laser oscillation).

However, if the period of time until the returning light reaches the pumping LD 3 is long after the driving current of the pumping LD 3 becomes equal to or lower than the predetermined value, the processing efficiency of the high power light pulse signal generation device becomes worse.

Accordingly, in the embodiment of the invention, the driving current of the pumping LD 3 is appropriately controlled corresponding to the timing at which the returning light from the irradiated body reaches the pumping LD 3 so as to generate the state of the domain C2 of FIG. 2.

Figure 3:
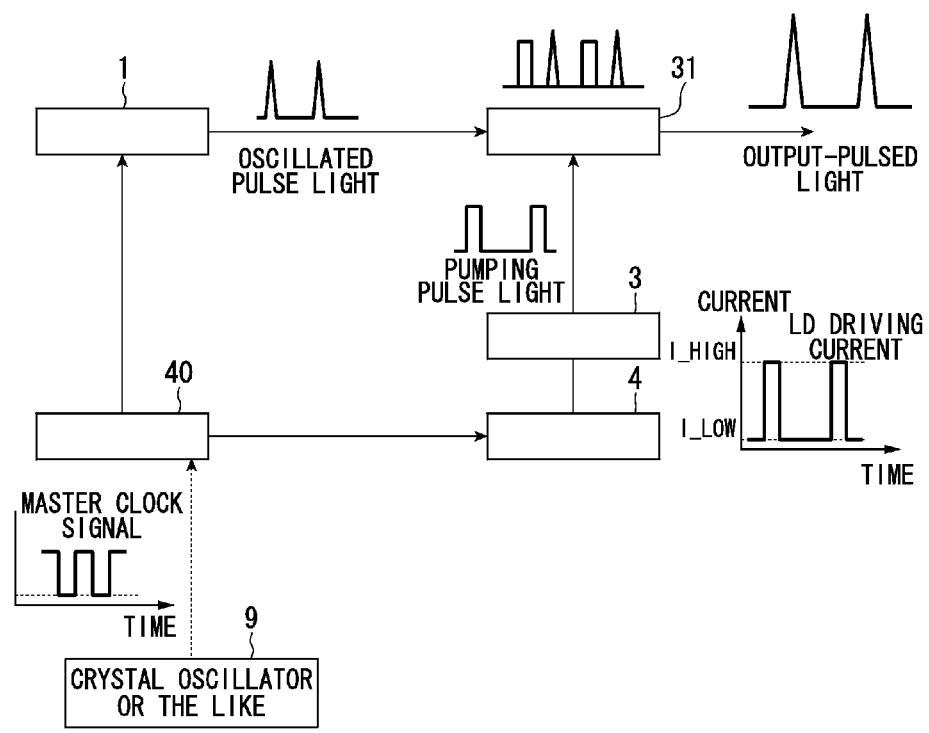
FIG. 3 is a diagram explaining the concept of the invention.

FIG. 3 shows a control situation in the high power pulsed light generator according to the embodiment of the invention.

A master clock generator 9 is connected to a signal input unit (not illustrated) of a control unit 40.

Furthermore, drivers (driving units) 4 for applying driving current to the master oscillator 1 and the pumping LD 3 are connected to a signal output unit (not illustrated) of the control unit 40.

The pulsed light (oscillation pulsed light) that is synchronized with the master clock signal is emitted from the master oscillator 1 and is incident to the optical amplifier 31.

The driving current that is applied from the driver 4 to the pumping LD 3 is controlled to be synchronized with the master clock signal under the control of the control unit 40.

The pumping pulse light according to the driving current is output from the pumping LD 3 and is incident to the optical amplifier 31 that is optically connected to the pumping LD 3.

In the optical amplifier 31 to which the pumping pulse light is incident, the gain of the amplification medium (not illustrated) increases, induced emission occurs in the amplification medium when the oscillation pulsed light is incident, and an amplified pulsed light is generated and emitted from the high power pulsed light generator as the output pulsed light.

Hereinafter, a more concrete embodiment of the invention will be described with reference to FIGS. 4 and 5.

Figure 4:
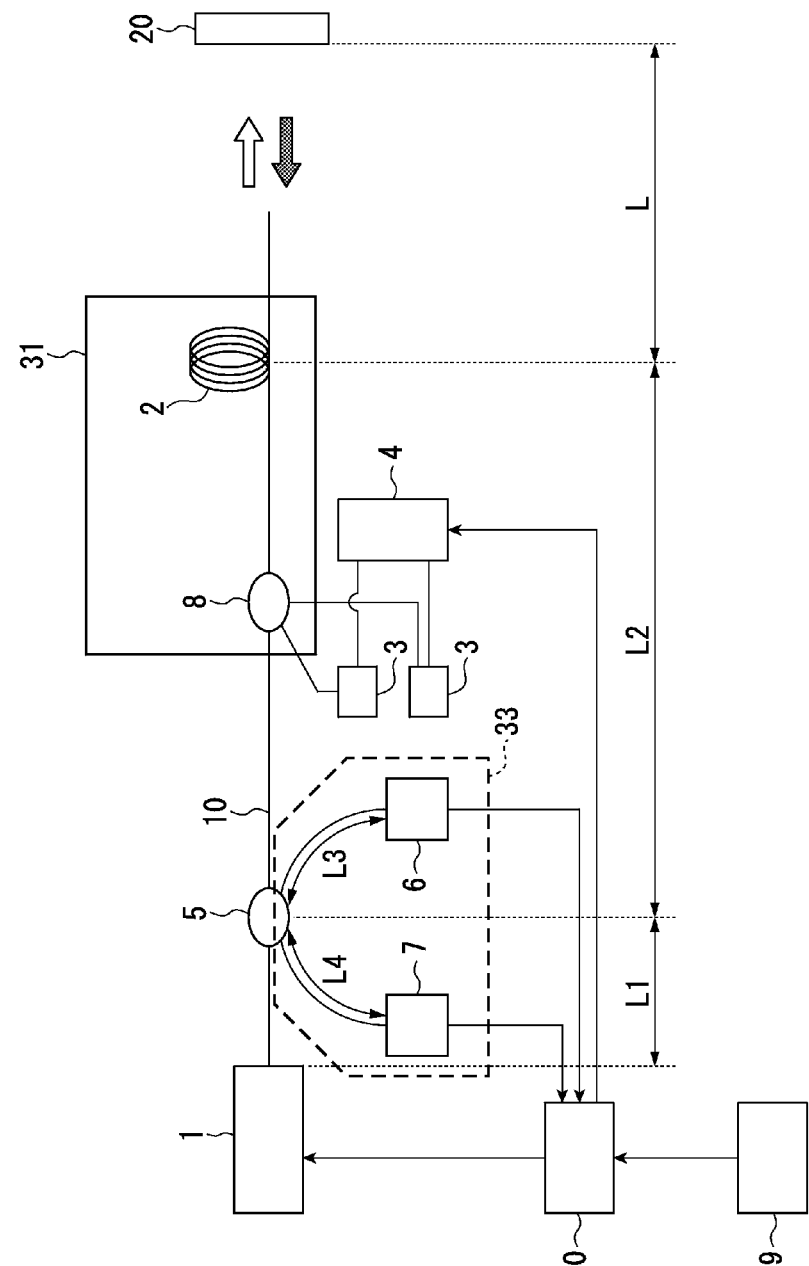
FIG. 4 is a schematic diagram illustrating the overall configuration of a high power pulsed light generator according to a first embodiment of the invention.

FIG. 4 illustrates a high power pulsed light generator according to a first embodiment of the invention.

The high power pulsed light generator includes an optical fiber 10, a master clock generator (crystal oscillator or the like) 9, a master oscillator 1, an optical amplifier 31, and a control unit 40.

The optical amplifier 31 for amplifying the oscillation pulsed light that is generated from the master oscillator 1 includes a Yb-doped double-clad fiber (DCF) 2 that is the amplification medium, and a pumping LD coupler 8.

The pumping LD 3 of the Yb-doped DCF 2 is optically connected to the Yb-doped DCF 2 by the pumping LD coupler 8.

Here, a driver 4 is connected to the pumping LD 3.

The high power pulsed light generator is configured so that by a fiber coupler 5 having directivity (hereinafter referred to as a "directional fiber coupler"), the oscillation pulsed light is incident to a photo-detector (PD) 6 only as a first monitor unit, and the returning light from the irradiated body 20 is incident to a photo-detector (PD) 7 only as a second monitor unit.

The signal light and reflected light monitor unit 33 having the PD 6 for detecting the oscillation pulsed light and the PD 7 for detecting the returning light from the irradiated body 20 is connected to the optical fiber 10.

The control unit 40 that controls the entire high power pulsed light generator is connected to the master oscillator 1 and the driver 4 that functions as a driving unit for driving the pumping LD 3.

Actually, as the control unit 40, a central processing unit (CPU) of a control computer, an electrically erasable programmable read only memory (EEPROM), and a field programmable gate array (FPGA) may be adopted.

Furthermore, as the fiber coupler 5, it is simple and easy to use a tap coupler with fiber or the like.

In this case, it is preferable that a tap branch ratio be adjusted to an appropriate value that is equal to or larger than 20 dB.

Next, the operation and function of the high power pulsed light generator illustrated in FIG. 4 will be described.

If a master clock signal is generated from the master clock generator 9, and a start signal of the oscillation pulsed light from the control unit 40 and a clock signal based on the master clock signal are input to the master oscillator 1, the oscillation pulsed light that is synchronized with the clock signal is generated from the master oscillator 1 and is incident to the Yb-doped DCF 2.

Furthermore, a pulsed driving current, which is controlled to be synchronized with the master clock signal by the control unit 40, is applied to the driver 4, and current corresponding to the driving current flows to the pumping LD 3 to emit the pumping light.

If the pumping light from the pumping LD 3 is incident to the Yb-doped DCF 2, Yb elements of the Yb-doped DCF 2 are excited, and a gain of the Yb-doped DCF 2 increases to heighten the population inversion rate. Accordingly, through the generation of the induced emission, an amplified output pulsed light is emitted from the Yb-doped DCF 2.

The output pulsed light output from the Yb-doped DCF 2 propagates through the optical fiber 10, is output from the high power pulsed light generator, and then the irradiated body 20 is irradiated with the output pulsed light.

The returning light from the irradiated body 20 is incident from the emission surface of the high power pulsed light generator into the device, propagates through the optical fiber 10, and then reaches the pumping LD 3 of the optical amplifier 31.

At this time, if the pumping LD 3 is in a laser oscillation state, that is, in an ON state, the pumping LD 3 may be damaged.

Figure 5:
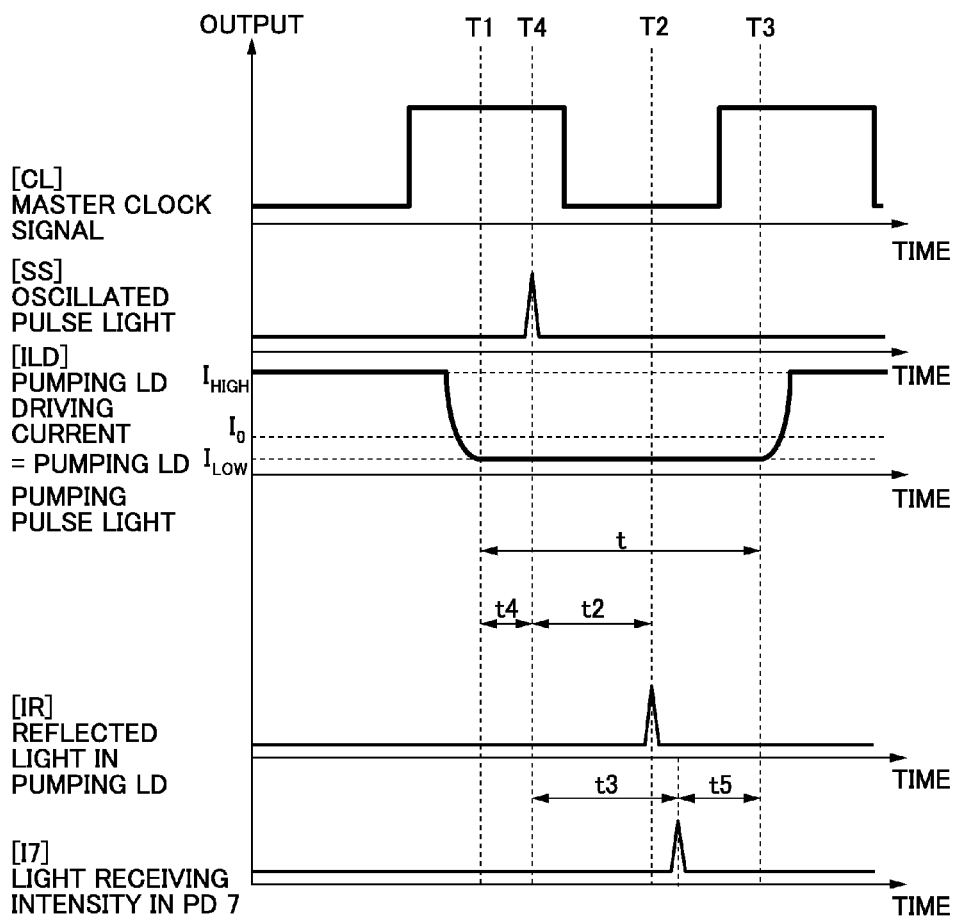
FIG. 5 is a diagram illustrating a time chart in a high power pulsed light generator according to the first embodiment of the invention.
Figure 6:
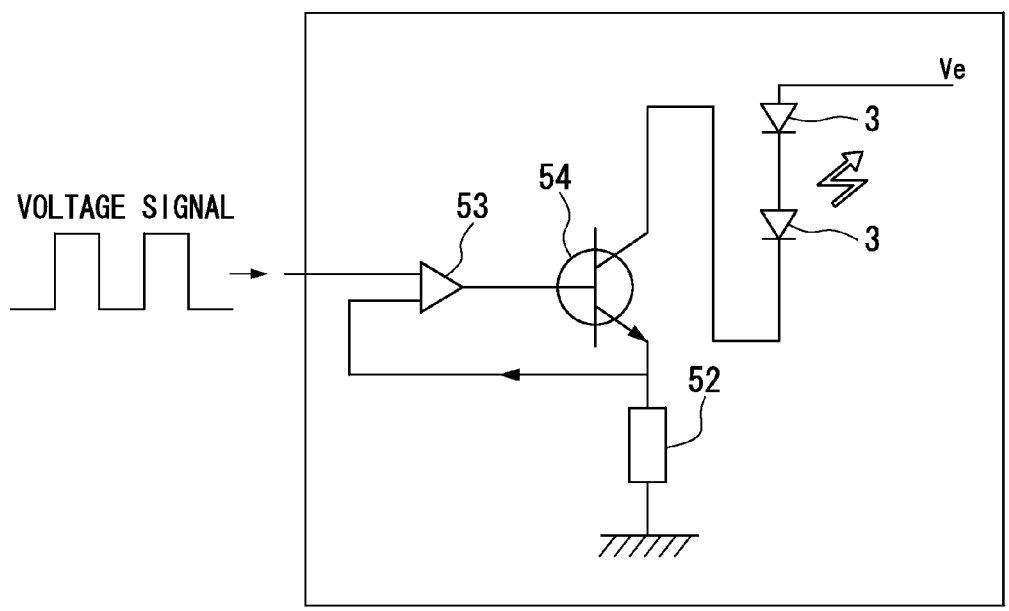
FIG. 6 is a schematic diagram illustrating the basic configuration of a conventional shunt type constant current circuit.

FIG. 5 illustrates a time chart in the high power pulsed light generator according to the embodiment illustrated in FIG. 4. Hereinafter, the time chart of FIG. 5 will be described with reference to FIG. 4.

As illustrated in FIG. 4, L1, L2, L, L3, and L4 are defined as follows.

L1: Propagation distance of light from the master oscillator 1 to the fiber coupler 5

L2: Propagation distance of light from the fiber coupler 5 to Yb-doped DCF 2

L: Propagation distance of light from Yb-doped DCF 2 to the irradiated body 20

L3: Propagation distance of light from the fiber coupler 5 to PD 6

L4: Propagation distance of light from the fiber coupler 5 to PD 7

Furthermore, it is assumed that n denotes a refractive index of a core of the optical fiber 10, n0 denotes a refractive index of air, and c denotes a light velocity in a vacuum.

Here, it is assumed that a driving current state in which the pumping LD 3 is in an OFF state (state in which the driving current is less than or equal to the predetermined value) is a first state, and a driving current state in which the pumping LD 3 is in an ON state (state in which the driving current exceeds the predetermined value) is a second state.

The driving current may be changed between the first state and the second state by the control unit 40.

Furthermore, as illustrated in FIGS. 5, T1, T2, T3, and T4 are defined as follows.

T1: Timing at which the driving current [ILD] of the pumping LD 3 becomes the first state T2: Timing at which the returning light [IR] from the irradiated body 20 reaches the pumping LD 3 of the optical amplifier 31

T3: Timing just before [ILD] becomes the second state

T4: Timing at which the oscillation pulsed light [Ss] is generated

In order to prevent the damage of the pumping LD 3, the driving current of the pumping LD 3 must be in the first state when the returning light from the irradiated body reaches the pumping LD 3.

Here, if the propagation distance of light in the Yb-doped DCF 2 and the propagation distance of light between the pumping LD coupler 8 and the pumping LD 3 are ignored and as illustrated in FIG. 5, the period of time from T1 to T4 is set to t4, in control, t4>0 is a necessary condition to make the driving current of the pumping LD 3 in the first state when the returning light reaches the pumping LD 3.

If it is assumed that the period of time from T4 to T2 is t2, t2 becomes $$t2=\{(L1+L2)c/n\}+(2Lc/n0)$$

Here, in order to prevent the damage of the pumping LD 3, the driving current of the pumping LD 3 must be in the first state even after time (t4+t2) elapses from T1 when the returning light from the irradiated body reaches the pumping LD 3.

Furthermore, if it is assumed that the time from T4 to the time in which [IR] reaches the pumping LD 3 and is received in the PD 7 as the pulsed light [I7] is t3, t3 becomes $$t3=t2+(L2+L4)c/n$$

However, if the propagation distance of the light in the Yb-doped DCF 2 and the propagation distance of the light between the pumping LD coupler 8 and the pumping LD 3 are relatively long with respect to the propagation distances L1, L2, and L, it is necessary to calculate the time t2 and t3 in consideration of the two propagation distances instead of ignoring them.

If it is assumed that the period of time from T1 to T3 is t, in order to prevent the damage of the pumping LD 3, it is necessary to form t>(t4+t3) in addition to t4>0 as described above.

That is, even when the returning light from the irradiated body reaches the pumping LD 3, the driving current of the pumping LD 3 should be in the first state.

Accordingly, it is assumed that the condition regarding the above-described t is a "pumping LD damage prevention condition".

Furthermore, t2 is calculated from the distance L between the Yb-doped DCF 2 and the irradiated body 20.

(For example, if L is L=1 m, t2 becomes t2=5 ns). Normally, since L is within 20 m, t2 becomes within 100 ns, and the control speed of the driving current of the pumping LD 3 is time-resolvable at time of approximately 1 µs.

Accordingly, in many uses of the high power pulsed light generator according to the invention, the damage of the pumping LD 3 can be prevented if the driving current of the pumping LD 3 within 0.1 ns from the timing at which the oscillation pulsed light is input to the Yb-doped DCF 2 is set to be in the first state.

That is, as shown as the domain C2 in FIG. 2, the pumping LD 3 can be controlled to be in the OFF state at a time when the returning light is incident to the Yb-doped DCF 2, and thus the pumping LD 3 is prevented from being damaged.

Next, the function and operation of the signal light and reflected light monitor unit 33 will be described.

As illustrated in FIG. 4, the signal light and reflected light monitor unit 33 having PD 6 and PD 7 is connected to the optical fiber 10 through the directional fiber coupler 5 (molten extension type or the like).

By this structure, the PD 6 functions as a first monitor unit A that receives the oscillation pulsed light, and the PD 7 functions as a second monitor unit B that receives the returning light from the irradiated body 20.

Furthermore, the PD 6 that is the first monitor unit A generates an oscillated pulse detection signal based on a temporal analysis of the oscillation pulsed light.

The PD 7 that is the second monitor unit B generates a returning pulse detection signal based on a temporal analysis of the returning light.

The oscillated pulse detection signal and the returning pulse detection signal generated in the monitor units are applied to the control unit 40, and the timing control is performed by the detection signals.

Here, it is assumed that the period of time until T3 after the PD 7 receives [I7] is t5.

t5 is determined by L, L1 to L4, and t.

Furthermore, it is considered that the timing at which the oscillation pulsed light output from the master oscillator 1 is received in the PD 6 and the timing at which the pulsed light is incident to the Yb-doped DCF 2 are the same.

At this time, the timing at which the returning light from the irradiated body reaches the pumping LD 3 is between the light receiving timing in the PD 6 and the light receiving timing in the PD 7.

In the high power pulsed light generator according to this embodiment, t4 is a value that is calculated from the system condition of the master oscillator 1, and t5 is a value that is set by a user of the high power pulsed light generator according to this embodiment.

Through this, values of t4 and t5 are input to the control unit in advance, and the time t from a fall to a start for the driving current of the pumping LD 3 and the pumping pulse light is set as a "time obtained by adding a time difference between T1 and the time when the oscillation pulsed light is received in the PD 6, a time difference between the time when the pulsed light is received in the PD 6 and the time when the returning light from the irradiated body 20 is received in the PD 7, and t5".

Through this, the time t is obtained by t=t4+t3+t5. If t5 is t5>0, the pumping LD damage prevention condition is satisfied, and thus the damage of the pumping LD 3 due to the returning light from the irradiated body 20 can be prevented.

As described above, using the PD 6 and the PD 7, the oscillated pulse detection signal based on a temporal analysis of the oscillation pulsed light output from the master oscillator 1 and the returning pulse detection signal based on a temporal analysis of the returning light from the irradiated body 20 are fed back to the control unit 40.

The control unit 40 sends a signal for controlling the timing of the start of the driving current to the driver 4 of the pumping LD 3 so that the above-described pumping LD damage prevention condition is satisfied.

Through sending of the above-described signal, when the returning light reaches the pumping LD 3, the driving current of the pumping LD 3 becomes in the first state, and thus it is possible to prevent the pumping LD 3 from being damaged due to the returning light from the irradiated body 20.

Furthermore, by setting the timing of the start of the driving current so that the current value of the pumping LD becomes in the oscillation state at the control timing of the pumping LD driving current that is synchronized with the master clock signal after the returning light reaches the pumping LD, the pumping light can be immediately injected into the optical amplifier, and the laser processing or laser measurement can be performed with excellent efficiency while avoiding the optical damage of the pumping LD.

In the high power pulsed light generator according to the first embodiment, the light intensities of the oscillation pulsed light and the returning light are fed back to the control unit 40 using the PD 6 and the PD 7, and the pulse state driving current is controlled by the control unit 40 corresponding to the time difference between the two timings.

At this time, in the frequency of performing the control of the driving current through feedback of the time difference, the control of the driving current may be made only once when the position in which the irradiated body 20 is installed is determined, or may be made in every peak of the output pulsed light.

However, in either of the case where the irradiated body 20 is an object having a stepped portion and the case where the distance between the high power pulsed light generator and the irradiated body 20 is changed in a state where the output pulsed light is output from the high power pulsed light generator, it is preferable that the frequency of reflecting the time difference in the driving current of the pumping LD 3 correspond to every peak of the output pulsed light.

While the preferred embodiments of the invention have been described as above, the invention is not limited to the embodiments.

Additions, omissions, substitutions, and other modifications of the configuration can be made without departing from the scope of the present invention.

Although the high power pulsed light generator according to the invention is optimized to a light source for laser processing or laser measurement, the invention is not limited thereto, and is applicable to all the uses for which high power pulsed light is demanded.

What is claimed is:

1. A high-power pulse light generator comprising:
   a master clock generator generating a master clock signal;
   a master oscillator generating oscillated pulse light in synchronization with the master clock signal;
   an optical amplifier amplifying the oscillated pulse light output from the master oscillator and outputting high-power pulsed light;
   a pumping semiconductor laser generating pumping pulse light used for exciting the optical amplifier;
   a driving unit driving the pumping semiconductor laser by use of a pulsed driving current in synchronization with the master clock signal; and
   a control unit controlling the driving unit so that the driving current to be supplied to the pumping semiconductor laser becomes lower than or equal to a set value at which the pumping semiconductor laser is not in a laser oscillation state when returning light from an irradiated body with the high-power pulsed light reaches the pumping semiconductor laser connected to the optical amplifier, the control unit determining a timing of the control in accordance with an optical path length between the irradiated body and the pumping semiconductor laser.

2. The high-power pulse light generator according to claim 1, further comprising:
   a monitoring unit provided between the master oscillator and the optical amplifier, the monitoring unit detecting the oscillated pulse light and the returning light, the monitoring unit generating an oscillated pulse detection signal based on a temporal analysis of the oscillated pulse light and a returning pulse detection signal based on a temporal analysis of the returning light, wherein
   the oscillated pulse detection signal and the returning pulse detection signal are electrically led to the control unit, and
   the control unit controls, based on the oscillated pulse detection signal and the returning pulse detection signal, a period in which the driving current supplied to the pumping semiconductor laser becomes lower than or equal to the set value.

3. The high-power pulse light generator according to claim 1, further comprising:
   a first monitoring unit provided between the master oscillator and the optical amplifier, the first monitoring unit detecting the oscillated pulse light and generating an oscillated pulse detection signal based on a temporal analysis of the oscillated pulse light; and
   a second monitoring unit provided between the master oscillator and the optical amplifier, the second monitoring unit detecting the returning light and generating a returning pulse detection signal based on a temporal analysis of the returning light, wherein
   the oscillated pulse detection signal and the returning pulse detection signal are electrically led to the control unit, and
   the control unit controls, based on the oscillated pulse detection signal and the returning pulse detection signal, a period in which the driving current supplied to the pumping semiconductor laser becomes lower than or equal to the set value.

4. The high-power pulse light generator according to claim 1, wherein
   after the returning light reaches the pumping semiconductor laser, the driving current supplied to the pumping semiconductor laser is controlled so as to exceed the set value and to be a value at which the pumping semiconductor laser is in a laser oscillation state at a timing in synchronization with the master clock signal.

5. The high-power pulse light generator according to claim 1, further comprising:
   a monitoring unit provided between the master oscillator and the optical amplifier, the monitoring unit detecting the oscillated pulse light and the returning light, the monitoring unit generating an oscillated pulse detection signal based on a temporal analysis of the oscillated pulse light and a returning pulse detection signal based on a temporal analysis of the returning light, wherein
   the oscillated pulse detection signal and the returning pulse detection signal are electrically led to the control unit, and
   the control unit controls, based on the oscillated pulse detection signal and the returning pulse detection signal, a period in which the driving current supplied to the pumping semiconductor laser becomes lower than or equal to the set value, and wherein
   after the returning light reaches the pumping semiconductor laser, the driving current supplied to the pumping semiconductor laser is controlled so as to exceed the set value and to be a value at which the pumping semiconductor laser is in a laser oscillation state at a timing in synchronization with the master clock signal.

6. The high-power pulse light generator according to claim 1, further comprising:
   a first monitoring unit provided between the master oscillator and the optical amplifier, the first monitoring unit detecting the oscillated pulse light and generating an oscillated pulse detection signal based on a temporal analysis of the oscillated pulse light; and
   a second monitoring unit provided between the master oscillator and the optical amplifier, the second monitoring unit detecting the returning light and generating a returning pulse detection signal based on a temporal analysis of the returning light, wherein
   the oscillated pulse detection signal and the returning pulse detection signal are electrically led to the control unit, and
   the control unit controls, based on the oscillated pulse detection signal and the returning pulse detection signal, a period in which the driving current supplied to the pumping semiconductor laser becomes lower than or equal to the set value, and wherein after the returning light reaches the pumping semiconductor laser, the driving current supplied to the pumping semiconductor laser is controlled so as to exceed the set value and to be a value at which the pumping semiconductor laser is in a laser oscillation state at a timing in synchronization with the master clock signal.

* * * * *